United States Patent
Isokawa (10) Patent No.: US 10,957,546 B2
(45) Date of Patent: Mar. 23, 2021

(54) SUBSTRATE PROCESSING APPARATUS AND METHOD OF CONTROLLING THE SAME

(71) Applicant: EBARA CORPORATION, Tokyo (JP)

(72) Inventor: Hidetatsu Isokawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 170 days.

(21) Appl. No.: 15/963,777

(22) Filed: Apr. 26, 2018

(65) Prior Publication Data

US 2018/0315611 A1 Nov. 1, 2018

(30) Foreign Application Priority Data

May 1, 2017 (JP) ................... 2017-091413

(51) Int. Cl.
*H01L 21/306* (2006.01)
*H01L 21/304* (2006.01)
*B24B 37/04* (2012.01)
*B24B 55/06* (2006.01)
(Continued)

(52) U.S. Cl.
CPC ............ *H01L 21/306* (2013.01); *B24B 37/04* (2013.01); *B24B 55/06* (2013.01); *G03F 1/82* (2013.01); *H01L 21/304* (2013.01); *H01L 21/67028* (2013.01); *H01L 21/67173* (2013.01); *H01L 21/67219* (2013.01); *H01L 21/67253* (2013.01)

(58) Field of Classification Search
CPC ............ H01L 21/306; H01L 21/67028; H01L 21/67219; H01L 21/67253; H01L 21/304; H01L 21/67173; B24B 37/04; B24B 55/06; G03F 1/82

See application file for complete search history.

(56) References Cited

U.S. PATENT DOCUMENTS 5,024,766 A * 6/1991 Mahmud ................ C02F 1/008
   210/142
6,085,911 A * 7/2000 Greenleigh ............ B09C 1/02
   209/12.1

(Continued)

FOREIGN PATENT DOCUMENTS

JP  2001-269868 A  10/2001
JP  2003-100576 A   4/2003
(Continued)

Primary Examiner — Benjamin L Osterhout
(74) Attorney, Agent, or Firm — BakerHostetler (57) ABSTRACT

A substrate processing apparatus is disclosed. In an embodiment, a substrate processing apparatus includes a plurality of polishing units including discharge valves that can discharge water at a predetermined flow rate, a plurality of cleaning units including discharge valves that discharges water at a predetermined flow rate, and a controller that controls opening and closing of the discharge valve of each of the plurality of polishing units and the plurality of cleaning units, and the controller controls opening and closing of the discharge valves of the plurality of polishing units and the plurality of cleaning units based on predetermined priority orders allocated to the plurality of polishing units and the plurality of cleaning units, so that the total discharge flow rate from the plurality of polishing units and the plurality of cleaning units is a predetermined flow rate or less.

5 Claims, 7 Drawing Sheets (51) Int. Cl.
    *G03F 1/82*     (2012.01)
    *H01L 21/67*    (2006.01)

(56) References Cited

U.S. PATENT DOCUMENTS

| | | | | |
|---|---|---|---|---|
| 6,086,057 | A * | 7/2000 | Mitsumori | B01F 3/04985 |
| | | | | 210/750 |
| 6,354,922 | B1 * | 3/2002 | Sakurai | B24B 37/042 |
| | | | | 257/E21.23 |
| 6,358,128 | B1 * | 3/2002 | Sakurai | B24B 37/042 |
| | | | | 257/E21.23 |
| 2001/0034190 | A1 | 10/2001 | Tanikawa et al. | |
| 2003/0055522 | A1 | 3/2003 | Mukuta et al. | |
| 2004/0020520 | A1 * | 2/2004 | Kim | B08B 3/02 |
| | | | | 134/95.2 |
| 2005/0026455 | A1 * | 2/2005 | Hamada | C23F 1/18 |
| | | | | 438/782 |
| 2007/0221615 | A1 * | 9/2007 | Maeda | B24B 37/04 |
| | | | | 216/57 |
| 2009/0067959 | A1 * | 3/2009 | Takahashi | B24B 37/345 |
| | | | | 414/226.01 |
| 2013/0167947 | A1 | 7/2013 | Nakano et al. | |

FOREIGN PATENT DOCUMENTS

| | | |
|---|---|---|
| JP | 2010-205796 A | 9/2010 |
| JP | 2013-138089 A | 7/2013 |

* cited by examiner

SUBSTRATE PROCESSING APPARATUS AND METHOD OF CONTROLLING THE SAME

INCORPORATION BY REFERENCE

The present invention claims priority from Japanese Patent Application No. 2017-091413, filed May 1, 2017, the content of which is incorporated herein by reference.

BACKGROUND OF THE INVENTION

Field of the Invention

The present invention relates to a substrate processing apparatus that uses pure water, and a method of controlling the same.

Description of the Related Art

In a substrate processing apparatus such as a chemical mechanical polishing (CMP) apparatus that is included in a semiconductor manufacturing apparatus, when the chemical mechanical polishing apparatus is operating, polishing and cleaning of a substrate are performed using pure water by a polisher and a cleaner, and when the chemical mechanical polishing apparatus is stopped, pure water is used for keeping wet states of the polisher and the cleaner (refer to Japanese Unexamined Patent Application, First Publication No. 2010-205796).

When pure water is used for the above purposes, depending on the operating state of the apparatus, pure water can possibly stay in a pipe of the chemical mechanical polishing apparatus for a long time. In such a case, bacteria or the like are generated in pure water, and if water in which bacteria or the like are generated is used by the polisher and the cleaner, a wafer can possibly be damaged. Thus, in the chemical mechanical polishing apparatus, it is necessary to keep pure water existing in the pipe of the chemical mechanical polishing apparatus, in a clean state, by periodically discharging pure water existing in the pipe of the chemical mechanical polishing apparatus, to the outside, and supplying new pure water for supplementing an amount discharged to the outside. Such discharge of pure water to the outside is referred to as dummy dispense (DDSP), and when pure water is discharged to the outside, a predetermined valve in the pipe of the chemical mechanical polishing apparatus is opened.

Figure 7:
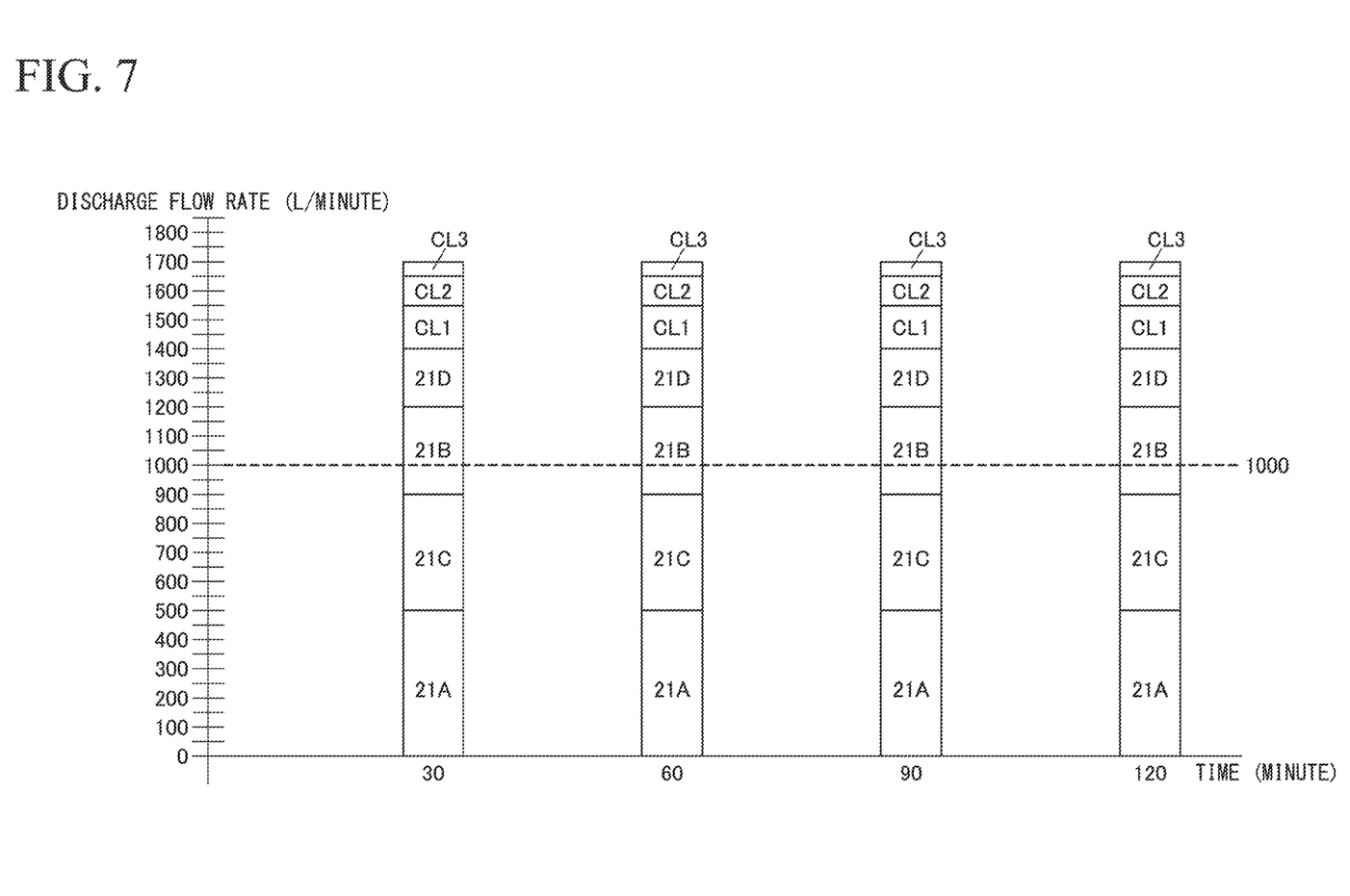
FIG. 7 is a diagram showing a discharge flow rate of a substrate processing apparatus according to a conventional technology.

In a conventional chemical mechanical polishing apparatus, when DDSP is implemented, in a pipe of an inactive portion of a polisher and a cleaner of the chemical mechanical polishing apparatus, a predetermined valve is opened/closed for 30 to 60 seconds for once during 30 minutes from an operation stop, for discharging pure water from the above pipe, but there can possibly occur a timing at which a plurality of valves are simultaneously opened as shown in FIG. 7. In the example shown in FIG. 7, water is discharged at a flow rate of 1700 liters per minute for 60 seconds at a time interval of 30 minutes. This is because all valves of polishing units 21A, 21B, 21C, and 21D included in the polisher, and cleaning units CL1, CL2, and CL3 included in the cleaner that are shown in FIG. 7 are opened, and the amount of pure water used by the entire chemical mechanical polishing apparatus extremely increases. In this manner, if there occurs a period in which the amount of pure water used by the entire chemical mechanical polishing apparatus extremely increases, a pure water supply system of a factory is affected. Thus, for example, pure water to be supplied to another apparatus requiring pure water can possibly become insufficient. In addition, if the amount of pure water used by the entire chemical mechanical polishing apparatus extremely increases, discharged water temporarily increases sharply. Such a conventional situation needs to be improved in a factory in which a steady operation of an apparatus is desired.

In addition, for suppressing running cost of the entire factory, a maximum used amount of resources including pure water is expected to be minimized (averaged) so as to keep the amount of pure water used per apparatus used in the factory, constant. Thus, in DDSP of the chemical mechanical polishing apparatus, a reduction in discharge flow rate is demanded so that an upper limit of a discharge flow rate can be reduced from the conventional amount of 1700 liters per minute to 1000 liters per minute, for example, as indicated by a dotted line in FIG. 7.

SUMMARY OF THE INVENTION

The present invention has been made in view of the circumstances described above, and provides a substrate processing apparatus and a method of controlling the same.

A first aspect of the present invention is a substrate processing apparatus, and in a substrate processing apparatus including a plurality of polishing units including discharge valves that discharges water at a predetermined flow rate, a plurality of cleaning units including discharge valves that discharges water at a predetermined flow rate, and a controller that controls opening and closing of the discharge valve of each of the plurality of polishing units and the plurality of cleaning units, the controller controls opening and closing of the discharge valves of the plurality of polishing units and the plurality of cleaning units based on predetermined priority orders allocated to the plurality of polishing units and the plurality of cleaning units, so that a total discharge flow rate from the plurality of polishing units and the plurality of cleaning units is a predetermined flow rate or less.

According to the above first aspect, the total discharge rate from the plurality of polishing units including the discharge valves, and the plurality of cleaning units including the discharge valves can be set to a desired flow rate or less.

A second aspect of the present invention is that, in the substrate processing apparatus of the first aspect, discharge from the plurality of polishing units has a higher priority order than discharge from the plurality of cleaning units.

According to the above second aspect, discharge from the plurality of polishing units can be prioritized over discharge from the plurality of cleaning units.

A third aspect of the present invention is that, in the substrate processing apparatus of the first or second aspect, when the total discharge flow rate obtained as a result of controlling opening and closing of the discharge valves provided in the plurality of polishing units and the plurality of cleaning units, based on the predetermined priority orders, so that the total discharge flow rate from the plurality of polishing units and the plurality of cleaning units is the predetermined flow rate or less has room to reach the predetermined flow rate, the controller controls opening and closing of the discharge valve of a unit that has a discharge flow rate equal to or less than the room, over the priority orders, so that the total discharge flow rate is an approximate upper limit of the predetermined flow rate.

According to the above third aspect, discharge can be performed using a flow rate close to a desired flow rate.

A fourth aspect of the present invention is that, in the substrate processing apparatus of the first or second aspect, a plurality of the discharge valves are provided for each of the plurality of polishing units, and a plurality of the discharge valves are provided for each of the plurality of cleaning units, and, based on the predetermined priority orders, the controller controls opening and closing of the plurality of the discharge valves provided in each of the plurality of polishing units and the plurality of cleaning units, by opening or closing all the plurality of the discharge valves, so that the total discharge flow rate from the plurality of polishing units and the plurality of cleaning units is the predetermined flow rate or less.

According to the above fourth aspect, even when a plurality of discharge valves are provided for each of the polishing units and the cleaning units, discharge can be performed using a desired flow rate or less.

A fifth aspect of the present invention is that, in the substrate processing apparatus of the fourth aspect, when the total discharge flow rate obtained as a result of performing control by opening or closing all the plurality of the discharge valves provided in each of the plurality of polishing units and the plurality of cleaning units, based on the predetermined priority orders, so that the total discharge flow rate from the plurality of polishing units and the plurality of cleaning units is the predetermined flow rate or less has room to reach the predetermined flow rate, and the room is smaller than a discharge flow rate of any of the plurality of polishing units and the plurality of cleaning units, the controller controls opening and closing of each of the plurality of the discharge valves provided in each of the plurality of polishing units and the plurality of cleaning units, so that the total discharge flow rate is an approximate upper limit of the predetermined flow rate.

According to the above fifth aspect, even when a desired flow rate is finely set, discharge can be performed using a flow rate close to a desired flow rate.

A sixth aspect of the present invention is a method of controlling a substrate processing apparatus, and in a method of controlling a substrate processing apparatus including a plurality of polishing units including discharge valves that discharges water at a predetermined flow rate, a plurality of cleaning units including discharge valves that discharges water at a predetermined flow rate, and a controller that controls opening and closing of the discharge valve of each of the plurality of polishing units and the plurality of cleaning units, the controller controls opening and closing of the discharge valves of the plurality of polishing units and the plurality of cleaning units based on predetermined priority orders allocated to the plurality of polishing units and the plurality of cleaning units, so that a total discharge flow rate from the plurality of polishing units and the plurality of cleaning units is a predetermined flow rate or less.

According to the above sixth aspect, the total discharge rate from the plurality of polishing units including the discharge valves, and the plurality of cleaning units including the discharge valves can be set to a desired flow rate or less.

A seventh aspect of the present invention is that, in the method of controlling a substrate processing apparatus of the sixth aspect, discharge from the plurality of polishing units has a higher priority order than discharge from the plurality of cleaning units.

According to the above seventh aspect, discharge from the plurality of polishing units can be prioritized over discharge from the plurality of cleaning units.

An eighth aspect of the present invention is that, in the method of controlling a substrate processing apparatus of the sixth or seventh aspect, when the total discharge flow rate obtained as a result of controlling opening and closing of the discharge valves provided in the plurality of polishing units and the plurality of cleaning units, based on the predetermined priority orders, so that the total discharge flow rate from the plurality of polishing units and the plurality of cleaning units is the predetermined flow rate or less has room to reach the predetermined flow rate, the controller controls opening and closing of the discharge valve of a unit that has a discharge flow rate equal to or less than the room, over the priority orders, so that the total discharge flow rate is an approximate upper limit of the predetermined flow rate.

According to the above eighth aspect, discharge can be performed using a flow rate close to a desired flow rate.

A ninth aspect of the present invention is that, in the method of controlling a substrate processing apparatus of the sixth or seventh aspect, a plurality of the discharge valves are provided for each of the plurality of polishing units, and a plurality of the discharge valves are provided for each of the plurality of cleaning units, and, based on the predetermined priority orders, the controller controls opening and closing of the plurality of the discharge valves provided in each of the plurality of polishing units and the plurality of cleaning units, by opening or closing all the plurality of the discharge valves, so that the total discharge flow rate from the plurality of polishing units and the plurality of cleaning units is the predetermined flow rate or less.

According to the above ninth aspect, even when a plurality of discharge valves are provided for each of the polishing units and the cleaning units, discharge can be performed using a desired flow rate or less.

A tenth aspect of the present invention is that, in the method of controlling a substrate processing apparatus of the ninth aspect, when the total discharge flow rate obtained as a result of performing control by opening or closing all the plurality of the discharge valves provided in each of the plurality of polishing units and the plurality of cleaning units, based on the predetermined priority orders, so that the total discharge flow rate from the plurality of polishing units and the plurality of cleaning units is the predetermined flow rate or less has room to reach the predetermined flow rate, and the room is smaller than a discharge flow rate of any of the plurality of polishing units and the plurality of cleaning units, the controller controls opening and closing of each of the plurality of the discharge valves provided in each of the plurality of polishing units and the plurality of cleaning units, so that the total discharge flow rate is an approximate upper limit of the predetermined flow rate.

According to the above tenth aspect, even when a desired flow rate is finely set, discharge can be performed using a flow rate close to a desired flow rate.

According to the above aspects of the present invention, a total discharge rate from a substrate processing apparatus can be suppressed to a desired value or less. This can contribute to a steady operation of a factory, and minimization of a maximum used amount of resources including pure water.

DETAILED DESCRIPTION OF THE INVENTION

Embodiments of the present invention will be described below with reference to the drawings. In addition, in the following drawings, scale sizes of each member and graphs are appropriately changed for causing each member and graphs to be in recognizable sizes.

First Embodiment

Figure 1:
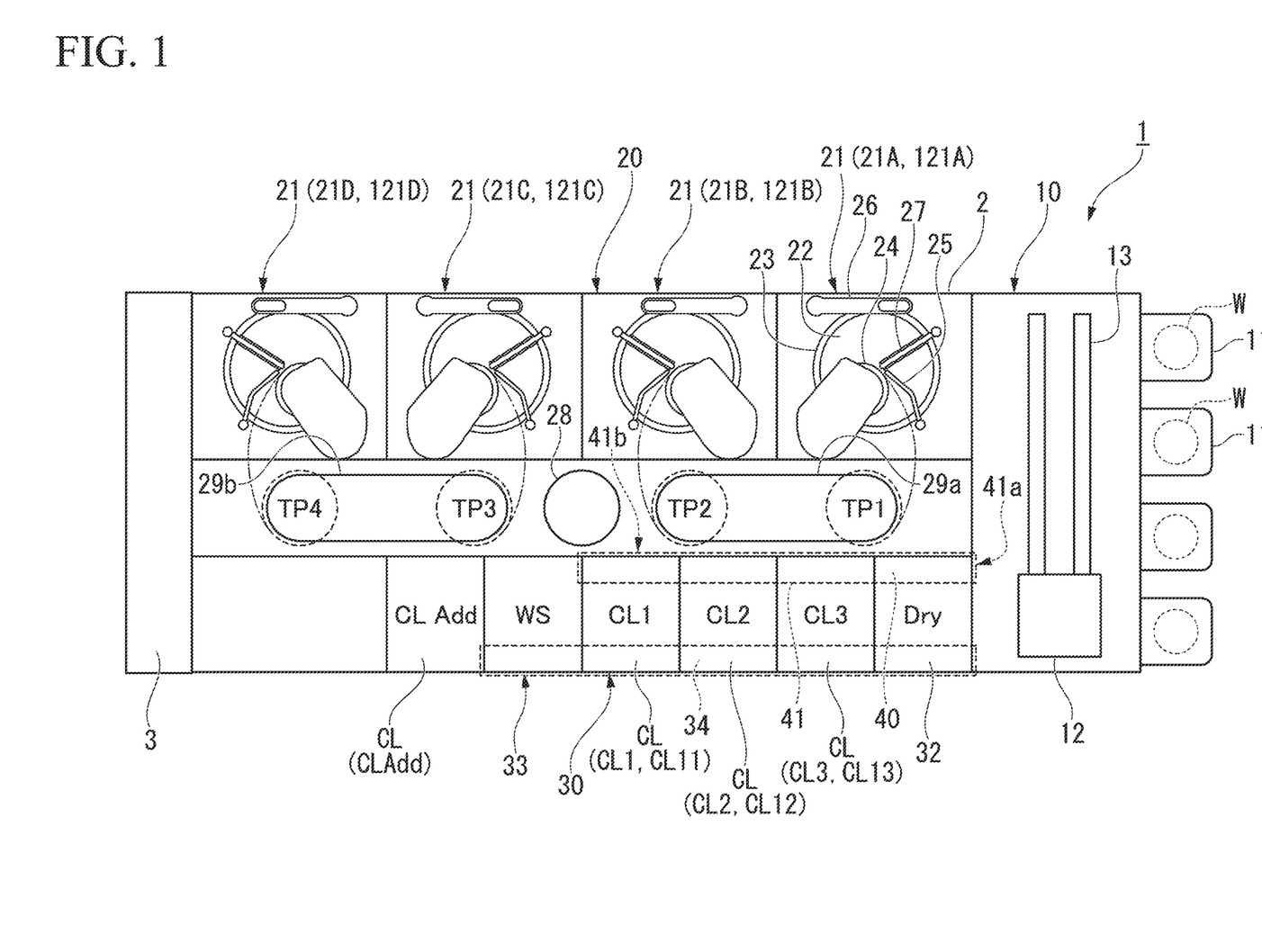
FIG. 1 is a front view of a substrate processing apparatus according to an embodiment of the present invention.

A first embodiment of the present invention will be described using FIG. 1. FIG. 1 is a front view of a substrate processing apparatus 1 according to the first embodiment.

The substrate processing apparatus 1 shown in FIG. 1 is a chemical mechanical polishing (CMP) apparatus that polishes a surface of a substrate W such as a silicon wafer, so as to be smooth. The substrate processing apparatus 1 includes a housing 2 having a rectangular box shape.

The housing 2 is formed in a substantially oblong shape in planar view. The inside of the housing 2 is separated into a loader/unloader 10, a polisher 20, and a cleaner 30 by partition walls. In addition, the substrate processing apparatus 1 includes a substrate conveyor 40 that conveys the substrate W from the loader/unloader 10 to the polisher 20, and a controller 3 (control board) that controls operations of the loader/unloader 10, the polisher 20, the cleaner 30, and the substrate conveyor 40, and operations of discharged water from the polisher 20 and the cleaner 30.

The loader/unloader 10 includes a front loader 11 that accommodates the substrate W. A plurality of front loaders 11 are provided on one side surface in a longitudinal direction of the housing 2. The plurality of front loaders 11 are arrayed in a width direction of the housing 2 (in a direction perpendicular to the longitudinal direction in planar view). The front loader 11 is equipped with, for example, an open cassette, a Standard Manufacturing Interface (SMIF) pod, or a Front Opening Unified Pod (FOUP). The SMIF and the FOUP are closed containers that accommodate a cassette of the substrate W thereinside, and cover the cassette using partition walls, and can keep an environment independent of an external space.

In addition, the loader/unloader 10 includes a conveyance robot 12 that takes the substrates W in and out from the front loaders 11, and a running mechanism 13 that causes the conveyance robot 12 to run along the array of the front loaders 11. The conveyance robot 12 includes two hands at an upper portion and a lower portion, and uses different hands for a processed substrate W and an unprocessed substrate W. For example, when the substrate W is returned to the front loader 11, an upper hand is used, and when the unprocessed substrate W is taken out from the front loader 11, a lower hand is used.

The substrate conveyor 40 includes a substrate conveyance path 41 extending in the longitudinal direction of the housing 2. In planar view, the substrate conveyance path 41 passes through a region in which the cleaner 30 is disposed, one end portion 41a is communicated with the loader/unloader 10, and another end portion 41b is communicated with the polisher 20. The substrate conveyance path 41 is provided with a slide stage that supports the substrate W, and a stage moving mechanism that moves the slide stage between the one end portion 41a and the other end portion 41b. The one end portion 41a is an entrance port of the substrate W, is normally closed by a shutter, and is opened when the conveyance robot 12 of the loader/unloader 10 makes access. In addition, the other end portion 41b is an exit port of the substrate W, is normally closed by a shutter, and is opened when a conveyance robot 28 of the polisher 20 makes access.

The polisher 20 includes a plurality of polishing units 21 (21A, 21B, 21C, and 21D) that perform polishing (or also referred to as grinding or planarization) of the substrates W. The plurality of polishing units 21 are arrayed in the longitudinal direction of the housing 2. The polishing unit 21 includes a polishing table 23 that rotates a polishing pad 22 having a polishing surface, a top ring 24 that holds the substrate W, and polishes the substrate W while pressing the substrate W against the polishing pad 22 on the polishing table 23, a polishing liquid supply nozzle 25 that supplies polishing liquid or dressing liquid (e.g., pure water) to the polishing pad 22, a dresser 26 that performs dressing of the polishing surface of the polishing pad 22, and an atomizer 27 that nebulizes mixed fluid of liquid (e.g. pure water) and gas (e.g. nitrogen gas), or liquid (e.g. pure water), and sprays the mixed fluid or the liquid onto the polishing surface.

The polishing unit 21 polishes the substrate W and planarizes the surface by pressing the substrate W against the polishing pad 22 using the top ring 24 while supplying polishing liquid from the polishing liquid supply nozzle 25 onto the polishing pad 22, and furthermore, relatively moving the top ring 24 and the polishing table 23. In the dresser 26, hard particles such as diamond particles and ceramic particles are fixed to a leading-end rotating portion that contacts the polishing pad 22, and the dresser 26 performs uniform dressing of the entire polishing surface of the polishing pad 22 by rotating and swinging the rotating portion, to form a smooth polishing surface. By washing away grinding sludge, abrasive grains, and the like that remain on the polishing surface of the polishing pad 22, using high-pressure liquid, the atomizer 27 achieves cleanup of the polishing surface, and a dressing work of the polishing surface that is performed by the dresser 26, which is mechanical contact, that is, revitalization of the polishing surface.

In addition, the polisher 20 includes the conveyance robot 28, a first exchanger 29a, and a second exchanger 29b. In the polisher 20, a first conveyance position TP1, a second conveyance position TP2, a third conveyance position TP3, and a fourth conveyance position TP4 are set in order from the loader/unloader 10 side along the array of the plurality of polishing units 21. The first conveyance position TP1, the second conveyance position TP2, the third conveyance position TP3, and the fourth conveyance position TP4 are positions at which the substrates W are respectively delivered to the polishing unit 21A, the polishing unit 21B, the polishing unit 21C, and the polishing unit 21D. The respective polishing units 21 access the first conveyance position TP1, the second conveyance position TP2, the third conveyance position TP3, and the fourth conveyance position TP4 by the rotation of arms of the top rings 24.

Between the first exchanger 29a and the second exchanger 29b, the conveyance robot 28 performs delivery and receipt of the substrates W together with the substrate conveyor 40. The conveyance robot 28 includes a hand that holds the substrate W, an inversion mechanism that inverts the hand up and down, an extendable arm that supports the hand, an arm up-down movement mechanism that moves the arm up and down, an arm rotation mechanism that rotates the arm around an axis extending in a vertical direction, and the like. The conveyance robot 28 moves between the second conveyance position TP2 and the third conveyance position TP3, and sorts the substrate W received from the substrate conveyor 40, into the first exchanger 29a or the second exchanger 29b. In addition, the conveyance robot 28 receives the substrate W polished in the polishing module 21, from the first exchanger 29a or the second exchanger 29b, and delivers the substrate W to the cleaner 30.

The first exchanger 29a is a mechanism that conveys the substrates W between the first conveyance position TP1 and the second conveyance position TP2. The first exchanger 29a includes a plurality of slide stages that support the substrates W, a stage moving mechanism that moves the slide stages in a horizontal direction at different heights, a first pusher disposed at the first conveyance position TP1, a second pusher disposed at the second conveyance position TP2, and the like. Each of the slide stages includes a substantially-U-shaped notch portion through which the first pusher and the second pusher can pass up and down, and moves between the first conveyance position TP1 and the second conveyance position TP2 by the stage moving mechanism. The first pusher moves up and down at the first conveyance position TP1, and performs delivery and receipt of the substrates W between the slide stages and the top ring 24 of the polishing unit 21A. In addition, the second pusher moves up and down at the second conveyance position TP2, and performs delivery and receipt of the substrates W between the slide stages and the top ring 24 of the polishing unit 21B.

The second exchanger 29b is a mechanism that conveys the substrates W between the third conveyance position TP3 and the fourth conveyance position TP4. The second exchanger 29b includes a plurality of slide stages that support the substrates W, a stage moving mechanism that moves the slide stages in the horizontal direction at different heights, a third pusher disposed at the third conveyance position TP3, a fourth pusher disposed at the fourth conveyance position TP4, and the like. Each of the slide stages includes a substantially-U-shaped notch portion through which the third pusher and the fourth pusher can pass up and down, and moves between the third conveyance position TP3 and the fourth conveyance position TP4 by the stage moving mechanism. The third pusher moves up and down at the third conveyance position TP3, and performs delivery and receipt of the substrates W between the slide stages and the top ring 24 of the polishing unit 21C. In addition, the fourth pusher moves up and down at the fourth conveyance position TP4, and performs delivery and receipt of the substrates W between the slide stages and the top ring 24 of the polishing unit 21D.

The cleaner 30 (cleaning device) includes the plurality of cleaning units CL (CL1, CL2, CL3, and CLAdd) that perform cleaning of the substrates W, and a drying unit 32 (Dry) that dries the cleaned substrates W. The plurality of cleaning units CL and the drying unit 32 are arrayed in the longitudinal direction of the housing 2. A conveyance chamber 33 (WS: wafer station) is provided between the cleaning units CL1 and the cleaning unit CLAdd. The conveyance chamber 33 is provided with a stage on which the substrates W delivered from the conveyance robot 28 are to be placed. In addition, the cleaner 30 includes a cleaner substrate conveyance mechanism 34 that picks up the substrate W placed on the stage of the conveyance chamber 33, and conveys the substrate W between the plurality of cleaning units CL, the drying unit 32, and the conveyance chamber 33.

The cleaning unit CL1 is disposed adjacently to the conveyance chamber 33, and performs primary cleaning of the substrate W. In addition, the cleaning unit CL2 is disposed adjacently to the cleaning unit CL1, and performs secondary cleaning of the substrate W. In addition, the cleaning unit CL3 is disposed adjacently to the cleaning unit CL2, and performs tertiary cleaning of the substrate W. The drying unit 32 is disposed adjacently to the cleaning unit CL3, and performs Rotagoni dry (Iso-Propyl Alcohol (IPA) dry), for example. In addition, the cleaning unit CLAdd disposed at a position opposite to the cleaning unit CU over the cleaning unit CL1 and the conveyance chamber 33 is added according to the specification of cleaning, and for example, performs preliminary cleaning of the substrate W before cleaning processing of the cleaning unit CL1, CL2, and CL3. Each of the cleaning units CL and the drying unit 32 includes an opening portion with a shutter through which the substrate W and the cleaner substrate conveyance mechanism 34 that conveys the substrate W can pass. After drying, a shutter provided on the partition wall between the drying unit 32 and the loader/unloader 10 is opened, and the substrate W is taken out from the drying unit 32 by the conveyance robot 12.

When the substrate processing apparatus 1 (chemical mechanical polishing (CMP) apparatus) having the above constitution is operated, pure water to be used for polishing and cleaning of substrates is supplied to the polisher 20 and the cleaner 30 from a pipe (not shown). When the polisher 20 and the cleaner 30 are operating, because pure water continues to be supplied to the polisher 20 and the cleaner 30, pure water never stays in the pipe. Nevertheless, not all of the polishing units 21 (21A, 21B, 21C, and 21D) and the cleaning units CL (CL1, CL2, CL3, and CLAdd) provided in the polisher 20 and the cleaner 30 are always operating.

In addition, because main supply destinations of pure water in the present embodiment are the polishing units 21 (21A, 21B, 21C, and 21D) and the cleaning units CL (CL1, CL2, and CL3), in the following description, the description will be given using pure water supply to the polishing units 21 (21A, 21B, 21C, and 21D) and the cleaning units CL (CL1, CL2, and CL3), as an example.

For example, the polishing units 21 (21A, 21B, 21C, and 21D) and the cleaning units CL (CL1, CL2, and CL3) are assumed to operate for 8 hours and stop operations for 16 hours in one day. Because pure water supply to the polisher 20 and the cleaner 30 is stopped during 16 hours in which operations are stopped, bacteria or the like can possibly be generated in the pipe. Furthermore, if water in which bacteria or the like are generated is supplied to the polisher 20 and the cleaner 30 after the operations of the polishing units 21 and the cleaning units CL are restarted, the substrate W can possibly be damaged. Thus, for keeping pure water in the polisher 20 and the cleaner 30, in a clean state, normally, dummy dispense (DDSP) of supplying pure water to the polisher 20 and the cleaner 30 for 30 to 60 seconds is performed at a time interval of once every 30 minutes. Furthermore, a discharge rate of pure water discharged in performing DDSP needs to be suppressed to a desired flow rate or less.

Figure 2A:
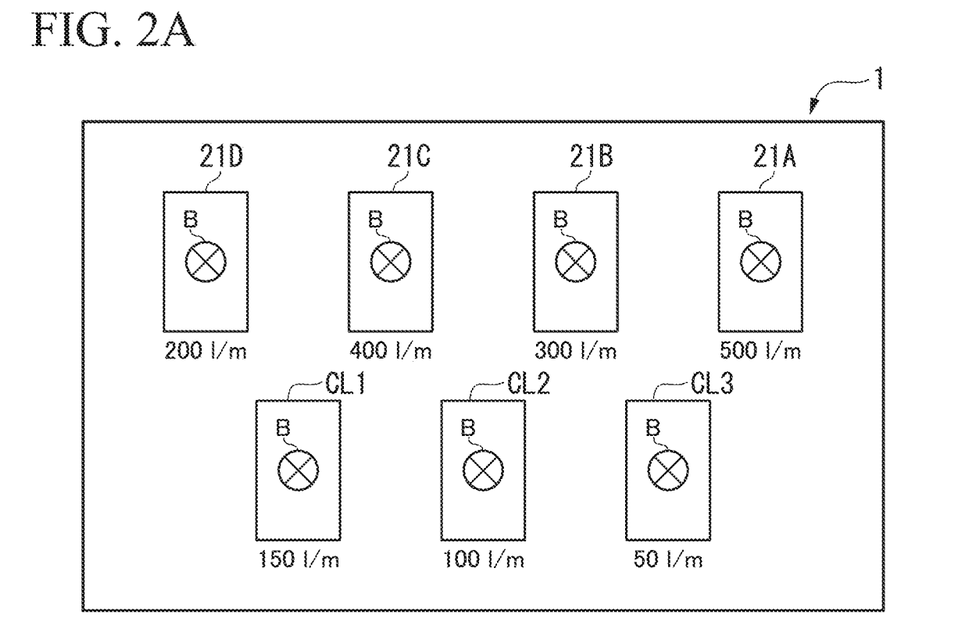
FIG. 2A is a schematic diagram of the substrate processing apparatus according to an embodiment of the present invention, and shows a case where a single discharge valve is provided for each unit.
Figure 2B:
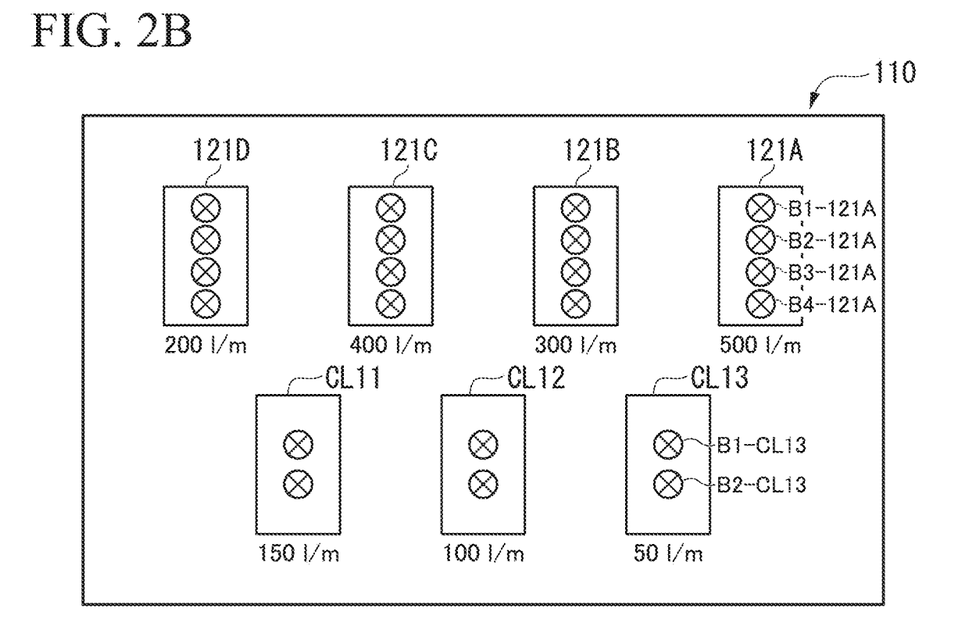
FIG. 2B is a schematic diagram of the substrate processing apparatus according to an embodiment of the present invention, and shows a case where a plurality of discharge valves are provided for each unit.
Figure 3:
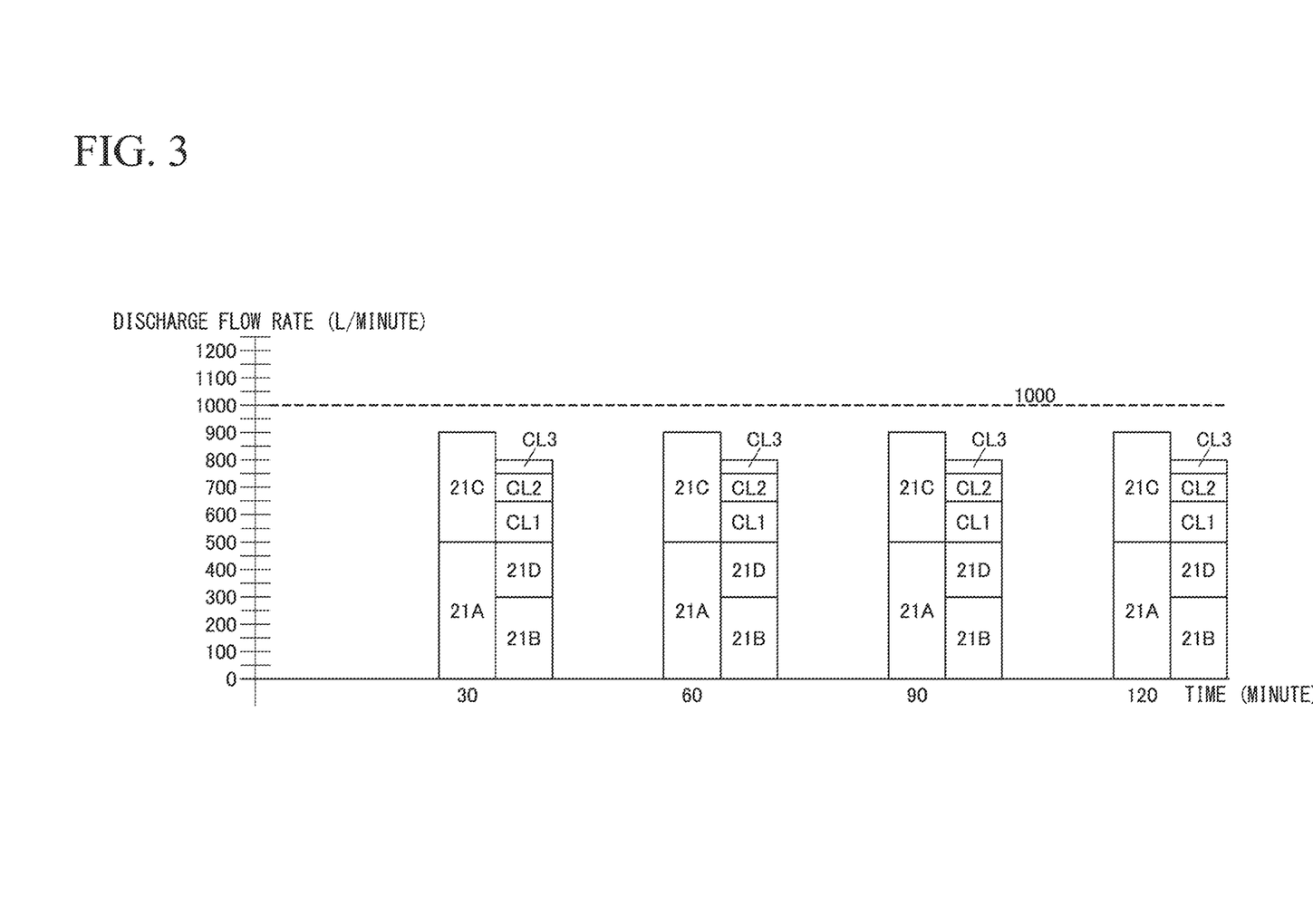
FIG. 3 is a diagram showing a discharge flow rate of the substrate processing apparatus according to an embodiment of the present invention.

Pure water supply to the polisher 20 and the cleaner 30 will be further described using FIGS. 2A to 3.

FIG. 2A is a schematic diagram of the substrate processing apparatus 1 according to the first embodiment, and shows the substrate processing apparatus 1 when a single discharge valve B is provided for each unit. FIG. 2B shows a substrate processing apparatus 110 when a plurality of discharge valves B are provided for each unit FIG. 3 is a diagram showing a discharge flow rate of the substrate processing apparatus 1 according to the first embodiment.

In the first embodiment, as shown in FIG. 2A, one discharge valve B is provided for each of all the polishing units 21 (21A, 21B, 21C, and 21D) and the cleaning units CL (CL1, CL2, and CL3).

Pure water supply from a pure water supply source (not shown) to the polishing units 21 (21A, 21B, 21C, and 21D) and the cleaning units CL (CL1, CL2, and CU) is started when the one discharge valve B provided for each of the polishing units 21 (21A, 21B, 21C, and 21D) and the cleaning units CL (CL1, CL2, and CL3) is opened by the controller 3. In this case, when pure water is supplied from the pure water supply source (not shown) to the polishing units 21 (21A, 21B, 21C, and 21D) and the cleaning units CL (CL1, CL2, and CU), pure water staying in the pipe that has the same amount as a supplied amount is discharged from the polishing units 21 (21A, 21B, 21C, and 21D) and the cleaning units CL (CL1, CL2, and CL3) by being pushed out by newly-supplied pure water.

Here, in the present embodiment, it is assumed that 500 liters of water is discharged per minute from the polishing unit 21A, 300 liters of water is discharged per minute from the polishing unit 21B, 400 liters of water is discharged per minute from the polishing unit 21C, and 200 liters of water is discharged per minute from the polishing unit 21D. In addition, it is assumed that 150 liters of water is discharged per minute from the cleaning unit CL1, 100 liters of water is discharged per minute from the cleaning unit CL2, and 50 liters of water is discharged per minute from the cleaning unit CL3 (refer to FIG. 2A).

Furthermore, a flow rate of 1700 liters per minute that is caused when all the discharge valves B provided in the polishing units 21 (21A, 21B, 21C, and 21D) and the cleaning units CL (CL1, CL2, and CU) are opened will be referred to as a supposed maxim flow rate, and an upper limit of a discharge flow rate that can be arbitrarily set without exceeding the supposed maxim flow rate (flow rate of 1000 liters per minute in the example in FIG. 3) will be referred to as a total flow rate setting.

With reference to FIG. 3, the description will be given to a case where the total flow rate setting is set to 1000 liters per minute when the supposed maxim flow rate from the above polishing units 21 (21A, 21B, 21C, and 21D) and the cleaning units CL (CL1, CL2, and CL3) is 1700 liters per minute.

FIG. 3 is a diagram showing the first embodiment in which the total flow rate setting from the polishing units 21 (21A, 21B, 21C, and 21D) and the cleaning units CL (CL1, CL2, and CL3) is set to 1000 liters per minute, and priority orders are set to the order of discharge from the polishing units 21 (21A, 21B, 21C, and 21D) and the cleaning units CL (CL1, CL2, and CL3).

FIG. 3 shows that, in the first embodiment, discharge is performed in the order of the polishing unit 21A, the polishing unit 21C, the polishing unit 21B, the polishing unit 21D, the cleaning unit CL1, the cleaning unit CL2, and the cleaning unit CL3. In other words, discharge from the polishing unit 21A has the highest priority order, and discharge from the cleaning unit CL3 has the lowest priority order. In addition, it indicates that discharge from the polishing units 21 (21A, 21B, 21C, and 21D) has higher priority orders than discharge from the cleaning units CL (CL1, CL2, and CL3). This is for keeping pure water in the polishing unit 21 in a fresh state because the polishing unit 21 has a larger impact on the substrate W.

In other words, when the controller 3 opens the discharge valve B of the polishing unit 21A that has a flow rate of 500 liters per minute, and discharge of 500 liters per minute from the polishing unit 21A is started, there is room of a flow rate corresponding to 500 liters per minute, to reach a flow rate of 1000 liters per minute, which is an upper limit. Thus, the controller 3 opens the discharge valve B of the polishing unit 21C that has a flow rate of 400 liters per minute, and also starts discharge of 400 liters per minute from the polishing unit 21C. As a result, with the discharge of 500 liters per minute from the polishing unit 21A, and the discharge of 400 liters per minute from the polishing unit 21C, discharge of 900 liters per minute is performed and continued for about 60 seconds.

Here, while discharge from the polishing unit 21A and discharge from the polishing unit 21C are being continued, if the controller 3 opens the discharge valve B of the polishing unit 21B that has a flow rate of 300 liters per minute, and discharge of 300 liters per minute from the polishing unit 21B is also started, with the discharge of 500 liters per minute from the polishing unit 21A, the discharge of 400 liters per minute from the polishing unit 21C, and the discharge of 300 liters per minute from the polishing unit 21B, the amount of discharged water is 1200 liters in total. Because the discharge flow rate exceeds 1000 liters per minute being an upper limit, the controller 3 does not perform such a manipulation.

Thus, discharge of 300 liters per minute from the polishing unit 21B is started from a time point at which the controller 3 closes the discharge valve B of the polishing unit 21A, and discharge of discharged water with 500 liters per minute from the polishing unit 21A ends, or the controller 3 closes the discharge valve B of the polishing unit 21C, and discharge of 400 liters per minute from the polishing unit 21C ends. In this manner, the controller 3 controls opening and closing the discharge valves B so that the total of discharge flow rates does not exceed 1000 liters per minute.

Subsequently, if it is assumed that the discharge of discharged water with 500 liters per minute from the polishing unit 21A, and the discharge of 400 liters per minute from the polishing unit 21C end, the controller 3 opens the discharge valve B of the polishing unit 21B. Consequently, discharge of 300 liters per minute from the polishing unit 21B is started, and furthermore, discharge of 200 liters per minute from the polishing unit 21D is started by the controller 3 opening the discharge valve B of the polishing unit 21D. By the controller 3 opening the discharge valve B of the cleaning unit CL1, discharge of 150 liters per minute from the cleaning unit CL1 is started. Furthermore, by the controller 3 opening the discharge valve B of the cleaning unit CL2, discharge of 100 liters per minute from the cleaning unit CL2 is started. By the controller 3 opening the discharge valve B of the cleaning unit CL3, discharge of 50 liters per minute from the cleaning unit CL3 is started. Thus, discharge of 800 liters per minute in total is started and continued for about 60 seconds.

As shown in FIG. 3, repetition of the above discharge at an interval of 30 minutes can prevent the generation of bacteria or the like in the pipe of the polisher 20 and the cleaner 30 that is caused by long-term stay of pure water in the pipe of the polisher 20 and the cleaner 30. At the same time, a flow rate of discharged water can be suppressed to 1000 liters per minute being the total flow rate setting, or less, and impact on a pure water system of a factory can be reduced.

Here, control performed by the controller 3 is implemented by a central processing unit (CPU) executing a program for performing discharge in the order of the polishing unit 21A, the polishing unit 21C, the polishing unit 21B, the polishing unit 21D, the cleaning unit CL1, the cleaning unit CL2, and the cleaning unit CL3 so that a pre-registered discharge rate of each of the polishing units 21 (21A, 21B, 21C, and 21D) and the cleaning units CL (CL1, CL2, and CL3) does not exceed the set total flow rate setting when the discharge rate and the set total flow rate setting are compared. In other words, control performed by the controller 3 is implemented by the cooperation between software and hardware resources.

In addition, control performed by the controller 3 may be control of sequentially performing comparison between a discharge rate from a unit having a higher priority order, and the total flow rate setting, and deciding the discharge valve B to be opened, one by one. Alternatively, control may be performed such that the discharge valve B to be opened is decided in advance by comparing a pre-registered flow rate of each unit and the total flow rate setting, and the discharge valves B of a plurality of units are simultaneously opened.

According to the first embodiment, a total discharge rate from the plurality of polishing units 21 including the discharge valves B, and the plurality of cleaning units CL including the discharge valves B can be set to a desired flow rate or less, and steady operation of a factory can be helped.

FIG. 2B shows a case where a plurality of discharge valves B are provided for each of all the polishing units 121A, 121B, 121C, and 121D, and the cleaning units CL11, CL12, and CL13 of the substrate processing apparatus 110.

More specifically, FIG. 2B shows a case where four discharge valves B are provided for each of all the polishing units 121A, 121B, 121C, and 121D, and two discharge valves B are provided for each of all the cleaning units CL11, CL12, and CL13.

For example, as shown in FIG. 2B, four discharge valves provided in the polishing unit 121A are referred to as B1-121A, B2-121A, B3-121A, and B4-121A, and two discharge valves B provided in the cleaning unit CL13 are referred to as B1-CL13 and B2-CL13.

In addition, reference numerals of all the discharge valves B are not displayed in FIG. 2B, but the subsequent discharge valves are similarly referred to such that four discharge valves B provided in the polishing unit 121B are referred to as B1-121B, B2-121B, B3-121B, and B4-121B, four discharge valves B provided in the polishing unit 121C are referred to as B1-121C, B2-121C, B3-121C, and B4-121C, four discharge valves B provided in the polishing unit 121D are referred to as B1-121D, B2-121D, B3-121D, and B4-121D, two discharge valves B provided in the cleaning unit CL11 are referred to as B1-CL11 and B2-CL1, and two discharge valves B provided in the cleaning unit CL12 are referred to as B1-CL12 and B2-CL12.

Also in the case shown in FIG. 2B, similarly to the case shown in FIG. 2A, discharge is performed in the priority orders of the polishing unit 121A, the polishing unit 121C, the polishing unit 121B, the polishing unit 121D, the cleaning unit CL11, the cleaning unit CL12, and the cleaning unit CL13.

Also in the case of using the substrate processing apparatus 110 that is shown in FIG. 2B, by the controller 3 opening or closing all the plurality of discharge valves B provided in each of the polishing units 121A, 121B, 121C, and 121D and each of the cleaning units CL1, CL12, and CL13, control similar to the first embodiment that is shown in FIG. 3, which is a result of the controller 3 performing opening and closing control of one discharge valve B provided in each of the polishing units 21 (21A, 21B, 21C, and 21D) and each of the cleaning units CL (CL1, CL2, and CU) shown in FIG. 2A can be performed.

In this manner, even when a plurality of discharge valves B are provided, control similar to that when a single discharge valve B is provided can be performed.

Second Embodiment

Figure 4:
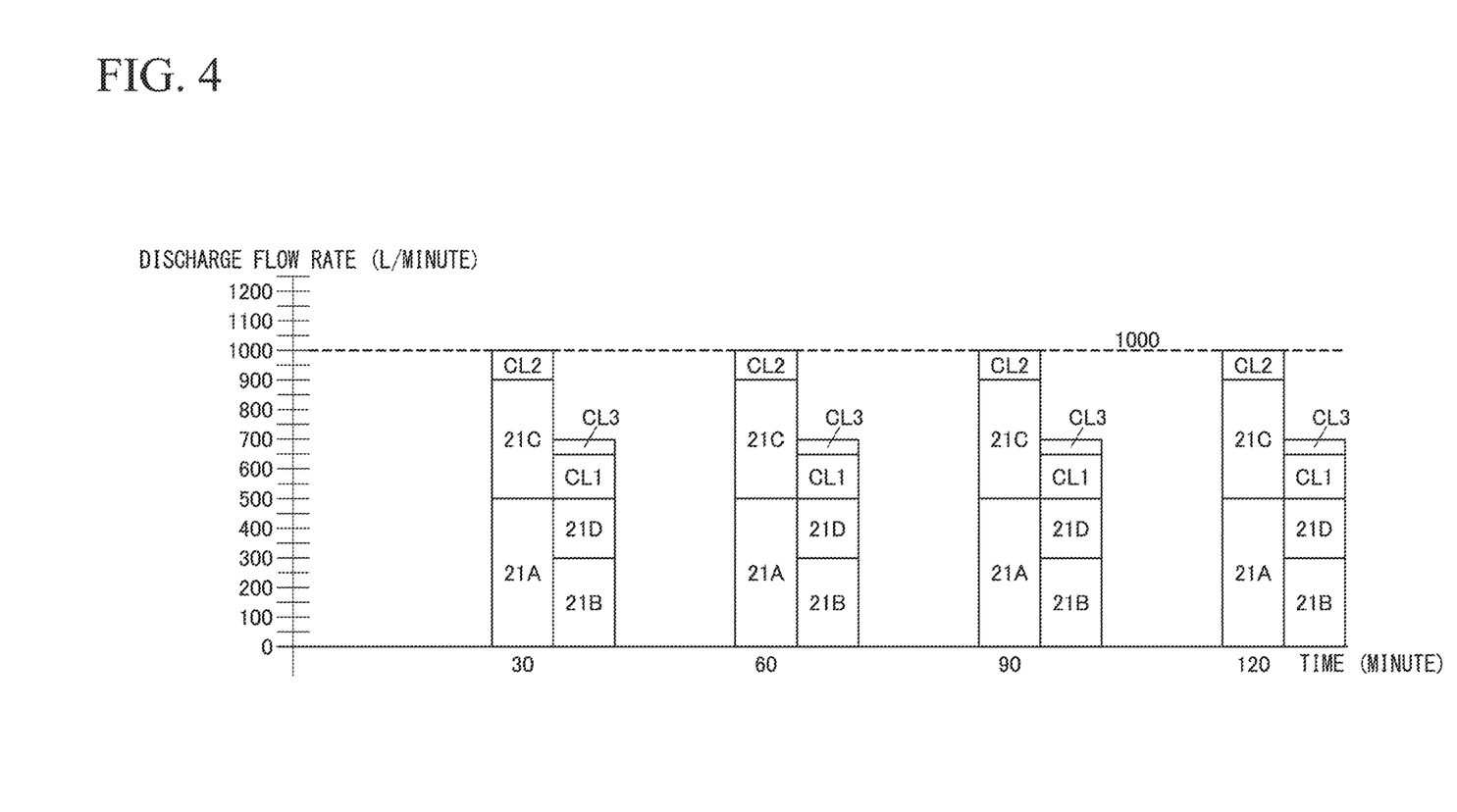
FIG. 4 is a diagram showing a discharge flow rate of the substrate processing apparatus according to an embodiment of the present invention.

A second embodiment of the present invention will be described using FIG. 4. FIG. 4 is a diagram showing a discharge rate of a substrate processing apparatus 1 according to the second embodiment.

In the second embodiment shown in FIG. 4, similarly to the first embodiment shown in FIG. 3, a total flow rate setting is set to 1000 liters per minute for a supposed maxim flow rate of 1700 liters per minute.

The second embodiment differs from the first embodiment in that the controller 3 controls opening and closing of the discharge valve B provided in each of the polishing units 21 (21A, 21B, 21C, and 21D), and each of the cleaning units CL (CL1, CL2, and CL3), over the priority orders set in the case of the first embodiment that is shown in FIG. 3, so that discharge flow rates from the polishing units 21 (21A, 21B, 21C, and 21D) and the cleaning units CL (CL1, CL2, and CL3) is substantially equal to 1000 liters per minute, which is a total flow rate setting. The details of the difference will be described using FIG. 4. In addition, in the following description, the redundant description overlapping the above embodiment will be omitted, and only a difference will be described.

Discharge is performed from the polishing unit 21A in accordance with the priority orders of the polishing unit 21A, the polishing unit 21C, the polishing unit 21B, the polishing unit 21D, the cleaning unit CL1, the cleaning unit CL2, and the cleaning unit CL3 that are used in the case of the first embodiment that is shown in FIG. 3.

In this case, if the controller 3 opens the discharge valve B of the polishing unit 21A that has a flow rate of 500 liters per minute, and causes water to be discharged from the polishing unit 21A by 500 liters per minute, there is room to reach 1000 liters per minute, which is an upper limit. Thus, the controller 3 opens the discharge valve B of the polishing unit 21C that has a flow rate of 400 liters per minute, and discharge of 400 liters per minute from the polishing unit 21C is started. As a result, with the discharge of 500 liters per minute from the polishing unit 21A, and the discharge of 400 liters per minute from the polishing unit 21C, discharge of 900 liters per minute is performed.

Nevertheless, even in the above case, there is room of a flow rate of 100 liters per minutes, with respect to 1000 liters per minute being the total flow rate setting. According to the above priority orders, after the polishing unit 21A and the polishing unit 21C, water is to be discharged from the polishing unit 21B. Nevertheless, because the discharge flow rate from the polishing unit 21B is 300 liters per minute, if discharge is also started from the polishing unit 21B in addition to the polishing unit 21A and the polishing unit 21C, a total flow rate is 1200 liters per minute, and a flow rate falling within 1000 liters per minute being the total flow rate setting cannot be realized.

In the second embodiment, in such a case, over the above priority orders, the controller 3 controls opening and closing of the discharge valve B provided in the cleaning unit CL2, in addition to the discharge valve B provided in the polishing unit 21A, and the discharge valve B provided in the polishing unit 21C, so that discharge from the cleaning unit CL2 having a flow rate of 100 liters per minute is started subsequently to discharge from the polishing unit 21A, and discharge from the polishing unit 21C.

As described above, in the second embodiment, discharge of 1000 liters per minute being equal to the total flow rate setting is implemented by the controller 3 controlling opening and closing of the discharge valve B provided in the cleaning unit CL2, in addition to the discharge valve B provided in the polishing unit 21A, and the discharge valve B provided in the polishing unit 21C.

If discharge from the polishing unit 21A, the polishing unit 21C, and the cleaning unit CL2 continues for 60 seconds and ends, with discharge of 300 liters per minute from the polishing unit 21B, discharge of 200 liters per minute from the polishing unit 21D, discharge of 150 liters per minute from the cleaning unit CL1, and discharge of 50 liters per minute from the cleaning unit CL3, discharge of 700 liters per minute in total is performed.

In the second embodiment, by control performed by the controller 3, discharge is performed in the priority orders of the polishing unit 21A, the polishing unit 21C, the polishing unit 21B, the polishing unit 21D, the cleaning unit CL1, the cleaning unit CL2, and the cleaning unit CL3 so that the pre-registered discharge rate of each of the polishing units 21 (21A, 21B, 21C, and 21D) and the cleaning units CL (CL1, CL2, and CL3) does not exceed the set total flow rate setting when the discharge rate and the set total flow rate setting are compared. Here, when an actual discharge flow rate has room to reach the total flow rate setting, control performed by the controller 3 is implemented by a central processing unit (CPU) executing a program for controlling opening and closing of the discharge valves B provided in the polishing units 21 (21A, 21B, 21C, and 21D) and the cleaning units CL (CL1, CL2, and CL3) that have a discharge flow rate equal to or less than the room, over the priority orders, so that the total discharge flow rate from the polishing units 21 (21A, 21B, 21C, and 21D) and the cleaning units CL (CL1, CL2, and CL3) is an approximate upper limit of the total flow rate setting. In other words, control performed by the controller 3 is implemented by the cooperation between software and hardware resources.

In addition, control performed by the controller 3 may be control of sequentially performing comparison between the discharge rate from a unit having a higher priority order, and the total flow rate setting, and deciding the discharge valve B to be opened, one by one, or control may be performed such that the discharge valve B to be opened is decided in advance by comparing a pre-registered flow rate of each unit, and the total flow rate setting, and the discharge valves B of a plurality of units are simultaneously opened.

According to the above second embodiment, discharge can be performed using a flow rate closer to the total flow rate setting.

In addition, similarly to the case of the first embodiment, the second embodiment can be applied to both of the case where a single discharge valve B is provided for each unit that is shown in FIG. 2A, and the case where a plurality of discharge valves B are provided for each unit that is shown in FIG. 2B.

Third Embodiment

Figure 5:
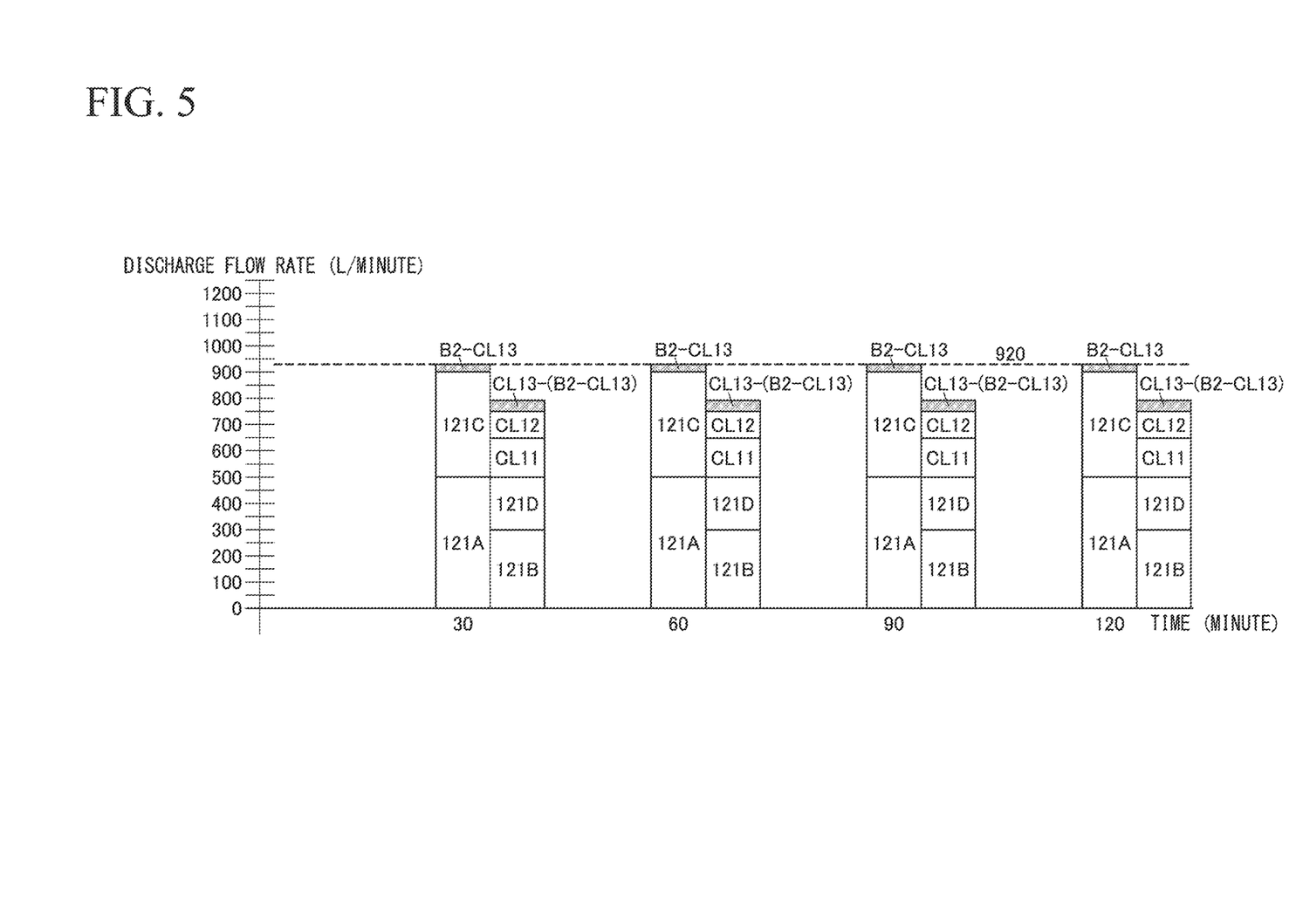
FIG. 5 is a diagram showing a discharge flow rate of the substrate processing apparatus according to an embodiment of the present invention.

A third embodiment of the present invention will be described using FIG. 5. FIG. 5 is a diagram showing a discharge rate of a substrate processing apparatus 110 according to the third embodiment.

The third embodiment shown in FIG. 5 differs from the first and second embodiments shown in FIGS. 3 and 4 in that a total flow rate setting is set to 920 liters per minute for a supposed maxim flow rate of 1700 liters per minute. In the following description, the redundant description overlapping the above embodiment will be omitted, and only a difference will be described.

In addition, the third embodiment is applied to the case where a plurality of discharge valves B are provided for each unit that is shown in FIG. 2B.

Here, discharge flow rates from the plurality of respective discharge valves B provided in each of the polishing units 121A, 121B, 121C, and 121D, and the cleaning units CL (CL11, CL12, and CL13) that are shown in FIG. 2B are assumed to be B1-121A (200 liters per minute), B2-121A (100 liters per minute), B3-121A (100 liters per minute), B4-121A (100 liters per minute), B1-121B (100 liters per minute), B2-121B (100 liters per minute), B3-121B (100 liters per minute), B4-121B (100 liters per minute), B1-121C (80 liters per minute), B2-121C (80 liters per minute), B3-121C (80 liters per minute), B4-121C (per minute 60 liter), B1-121D (50 liters per minute), B2-121D (50 liters per minute), B3-121D (50 liters per minute), B4-121D (50 liters per minute), B1-CL11 (per minute 75 liter), B2-CL11 (per minute 75 liter), B1-CL12 (50 liters per minute), B2-CL12 (50 liters per minute), B1-CL13 (25 liters per minute), and B2-CL13 (25 liters per minute).

The third embodiment differs from the first to second embodiments in that the controller 3 controls opening and closing of each of the plurality of discharge valves B provided in each of the polishing units 121A, 121B, 121C, and 121D, and each of the cleaning units CL (CL11, CL12, and CL13), over the priority orders, so that discharge flow rates is substantially equal to 920 liters per minute being the total flow rate setting. The details of the difference will be described using FIG. 5.

First, by opening all the plurality of discharge valves B1-121A, B2-121A, B3-121A, and B4-121A provided in the polishing unit 121A, in accordance with the priority orders of the polishing unit 121A, the polishing unit 121C, the polishing unit 121B, the polishing unit 121D, the cleaning unit CL11, the cleaning unit CL12, and the cleaning unit CL13, discharge is started from the polishing unit 121A.

In this case, if the controller 3 opens all the plurality of discharge valves B1-121A, B2-121A, B3-121A, and B4-121A of the polishing unit 121A that have a flow rate of 500 liters per minute, and causes water to be discharged from the polishing unit 121A by 500 liters per minute, there is room to reach 1000 liters per minute being an upper limit. Thus, the controller 3 opens all the plurality of discharge valves B1-121C, B2-121C, B3-121C, and B4-121C of the polishing unit 121C that have a flow rate of 400 liters per minute, and starts discharge of 400 liters per minute from the polishing unit 121C. As a result, with the discharge of discharged water with 500 liters per minute from the polishing unit 121A, and the discharge of 400 liters per minute from the polishing unit 121C, discharge of 900 liters per minute is performed.

Nevertheless, even in this case, there is room corresponding to 20 liters per minute, to reach 920 liters per minute being the total flow rate setting. According to the above priority orders, after the polishing unit 121A and the polishing unit 121C, water is to be discharged from the polishing unit 121B. Nevertheless, because a discharge rate from the polishing unit 121B is 300 liters per minute, if discharge is started from the polishing unit 121B in addition to discharge from the polishing unit 121A and the polishing unit 121C, a total flow rate is 1200 liters per minute, and a flow rate falling within 920 liters per minute being the total flow rate setting cannot be realized.

In the third embodiment, in such a case, the controller 3 controls opening and closing of the discharge valve B2-CL13 provided in the cleaning unit CL13, in addition to the plurality of discharge valves B provided in the polishing unit 121A, and the plurality of discharge valves B provided in the polishing unit 121C, so that discharge from the valve B2 of the cleaning unit CL13 that has a flow rate of 20 liters per minute is started subsequently to discharge from the polishing unit 121A, and discharge from the polishing unit 121C.

As described above, in the third embodiment, discharge of 920 liters per minute being equal to the total flow rate setting is implemented by the controller 3 opening the discharge valve B2-CL13 provided in the cleaning unit CL13, in addition to opening all the plurality of discharge valves B1-121A, B2-121A, B3-121A, and B4-121A provided in the polishing unit 121A, and opening all the plurality of discharge valves B1-121C, B2-121C, B3-121C, and B4-121C provided in the polishing unit 121C.

If discharge from the plurality of discharge valves B1-121A, B2-121A, B3-121A, and B4-121A provided in the polishing unit 121A, the plurality of discharge valves B1-121C, B2-121C, B3-121C, and B4-121C provided in the polishing unit 121C, and the discharge valve B2-CL3 provided in the cleaning unit CL13 continues for 60 seconds, the discharge ends.

After that, in accordance with the priority orders, discharge of 780 liters per minute is performed by discharge of 300 liters per minute from the plurality of discharge valves B1-121B, B2-121B, B3-121B, and B4-121B provided in the polishing unit 121B, discharge of 200 liters per minute from the plurality of discharge valves B1-121D, B2-121D, B3-121D, and B4-121D provided in the polishing unit 121D, discharge of 150 liters per minute from the plurality of discharge valves B1-CL11 and B2-CL1 provided in the cleaning unit CL11, discharge of 100 liters per minute from the plurality of discharge valves B1-CL12 and B2-CL12 provided in the cleaning unit CL12, and discharge of 30 liters per minute from the discharge valve B1-CL13 provided in the cleaning unit CL13.

According to the above third embodiment, even when the total flow rate setting is finely set, discharge can be performed using a flow rate close to the total flow rate setting.

Here, by the control performed by the controller 3, a pre-registered discharge flow rate of each of the polishing units 121A, 121B, 121C, and 121D, and the cleaning units CL (CL11, CL12, and CL13), a discharge flow rate from each of the plurality of discharge valves B provided in each of the polishing units 121A, 121B, 121C, and 121D, and the cleaning units CL (CL11, CL12, and CL13), and the set total flow rate setting are compared. Subsequently, by the control performed by the controller 3, discharge is performed in the priority orders of the polishing unit 121A, the polishing unit 121C, the polishing unit 121B, the polishing unit 121D, the cleaning unit CL11, the cleaning unit CL12, and the cleaning unit CL13, so as not to exceed the total flow rate setting. At the same time, control performed by the controller 3 is implemented by a central processing unit (CPU) executing a program for controlling opening and closing of the plurality of discharge valves B provided in each of the polishing units 121A, 121B, 121C, and 121D, and the cleaning units CL (CL11, CL12, and CL13) so that the total discharge flow rate is an approximate upper limit of the total flow rate setting, when an actual total discharge flow rate has room to reach the total flow rate setting, and when the room is smaller than a discharge flow rate of any of the polishing units 121A, 121B, 121C, and 121D, and the cleaning units CL (CL11, CL12, and CL13). In other words, control performed by the controller 3 is implemented by the cooperation between software and hardware resources.

In addition, control performed by the controller 3 may be control of sequentially performing comparison between a discharge rate from a unit having a higher priority order, discharge rates from the discharge valves B of each unit, and the total flow rate setting, and sequentially deciding the discharge valve B to be opened, for each unit or for each discharge valve B. Alternatively, control may be performed such that the discharge valve B to be opened is decided in advance by comparing a pre-registered flow rate of each unit, a flow rate of each discharge valve B of the unit, and the total flow rate setting, and all the discharge valves B of the plurality of units, and one discharge valve B of a certain unit are simultaneously opened.

Aside from the cases described in the above embodiments, the controller 3 may perform the following control.

Figure 6:
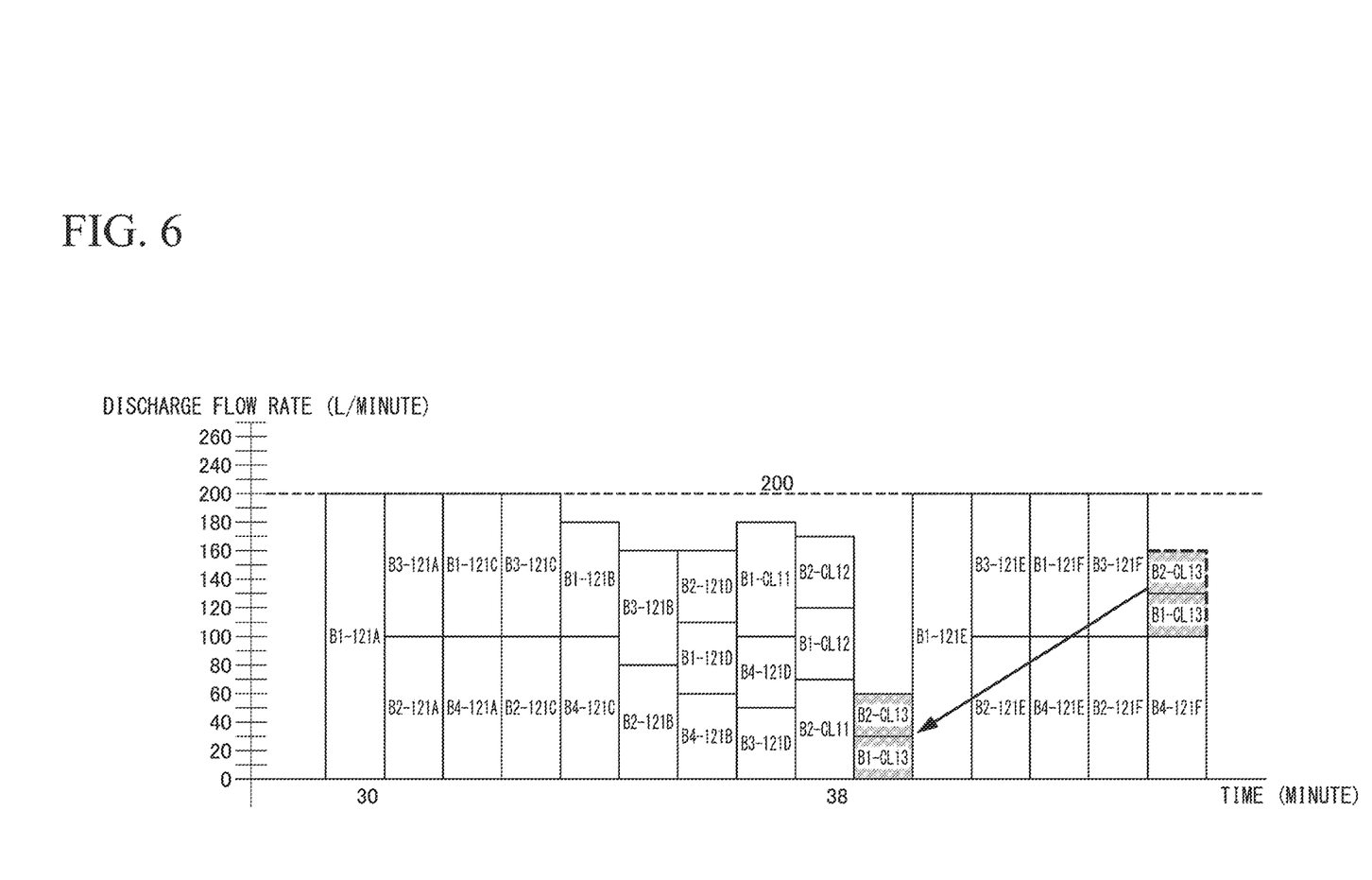
FIG. 6 is a diagram showing a discharge flow rate of the substrate processing apparatus according to an embodiment of the present invention.

In the case where a plurality of discharge valves B are provided for each unit that is shown in FIG. 2B, as shown in FIG. 6, a case where a total flow rate setting is set to 200 liters per minute will be considered.

As shown in FIG. 6, discharge is performed in the priority orders of the polishing unit 121A, the polishing unit 121C, the polishing unit 121B, the polishing unit 121D, the cleaning unit CL11, the cleaning unit CL12, and the cleaning unit CL13.

Nevertheless, because the total flow rate setting is 200 liters per minute, and is smaller than 500 liters per minute from the polishing unit 121A, discharge is sequentially started from each of the discharge valves B1-121A, B2-121A, B3-121A, and B4-121A of the polishing unit 121A.

In this case, discharge from the discharge valve B1-121A of the polishing unit 121A that has a flow rate of 200 liters per minute is first started, continues for 60 seconds, and ends. From the moment, discharge from the discharge valve B2-121 of the polishing unit 121A that has a flow rate of 100 liters per minute and has the second highest priority order, and the discharge valve B3-121 of the polishing unit 121A that has a flow rate of 100 liters per minute is started, and continues for 60 seconds.

In this manner, because discharge is sequentially performed for each of the discharge valves B, discharge from B1-CL13 and B2-CL13 that have the lowest priority order is performed after a certain degree of waiting time since discharge from the discharge valve B I-121A of the polishing unit 121A is started.

Normally, as for a waiting time of several minutes, a large difference is not produced in a generation status of bacteria or the like. Nevertheless, for example, as shown in FIG. 6, the substrate processing apparatus 1 is assumed to include polishing units 121E and 121F not shown in FIG. 2B that include other discharge valves having higher priority orders than the discharge valves B1-CL13 and B2-CL13 (in the example in FIG. 6, the discharge valve B1-121E, B2-121E, B3-121E, B4-121E, B1-121F, B2-121F, B3-121F, and B4-121F). In this case, discharge from the discharge valves B1-121E, B2-121E, B3-121E, B4-121E, B1-121F, B2-121F, B3-121F, and B4-121F of the polishing units 121E and 121F is assumed to be started before discharge of the discharge valves B1-CL13 and B2-CL13 having the lowest priority order is started. As a result, the start of discharge from B1-CL13 and B2-CL13 that have the lowest priority order is further delayed.

In the above case, for example, the priority orders of discharge from the discharge valves B1-CL13 and B2-CL13 may be brought forward as displayed by an arrow in FIG. 6, so that discharge from the discharge valves B1-CL13 and B2-CL13 that have the lowest priority order ends within ten minutes since discharge from the discharge valve B1-121A of the polishing unit 121A is first started.

In addition, for example, the controller 3 may perform control such that a storage unit (not shown) stores a discharge order from the polishing units 21 and the cleaning units CL that is used when performance of the substrate processing apparatus 1 is good, such as a case where a yield ratio is good, or a case where less foreign matters are detected, and discharge is performed in the same discharge order as that used when performance of the substrate processing apparatus 1 is good. This is because the substrate processing apparatus 1 can be expected to operate with high performance again if the discharge order used when performance of the substrate processing apparatus 1 is good is followed in this manner.

In addition, in the third embodiment, the controller 3 controls opening and closing of the plurality of discharge valves B provided in each of the polishing units 121A, 121B, 121C, and 121D, and the cleaning units CL (CL11, CL12, and CL13), so that the total discharge flow rate is an approximate upper limit of the total flow rate setting, when the total discharge flow rate has room to reach the total flow rate setting, and when the room is smaller than a discharge flow rate of any of the polishing units 121A, 121B, 121C, and 121D, and the cleaning units CL (CL11, CL12, and CL13). Nevertheless, the controller 3 may perform control such that the total discharge flow rate is equal to or less than the upper limit of the total flow rate setting, and discharge from the discharge valves B having a high priority order that are shown in FIG. 6 is prioritized.

In addition, a discharge priority order and a discharge rate of each unit, and a discharge priority order and a discharge rate of each discharge valve in the above embodiments are mere exemplary examples, and can be arbitrarily set.

In addition, the above-described function of a controller of each CMP apparatus may be provided for each manufacturing line in a factory, or one may be collectively provided for the entire factory, and in this case, the amount of pure water used by each manufacturing line or in the factory can be kept constant.

In addition, without departing from the scope of the present invention, the components in the substrate processing apparatus 1 according to the above-described embodiments can be appropriately substituted with known components, and in addition, methods of controlling the substrate processing apparatus 1 according to the above different embodiments may be appropriately combined.

Preferred embodiments of the present invention have been described, but the present invention is not limited to these embodiments. Additions, omissions, substitutions, and other modifications of constitutions can be performed without departing from the scope of the present invention. The present invention is not limited by the above description, and is limited only by the scope of the appended claims.

What is claimed is:

1. A substrate processing apparatus comprising: a plurality of polishing units comprising discharge valves that discharges water at a predetermined flow rate; a plurality of cleaning units comprising discharge valves that discharges water at a predetermined flow rate; and a controller that controls opening and closing of the discharge valve of each of the plurality of polishing units and the plurality of cleaning units, wherein the controller controls opening and closing of the discharge valves of the plurality of polishing units and the plurality of cleaning units based on predetermined priority orders allocated to the plurality of polishing units and the plurality of cleaning units, so that a total discharge flow rate from the plurality of polishing units and the plurality of cleaning units is a predetermined flow rate or less.

2. The substrate processing apparatus according to claim 1, wherein discharge from the plurality of polishing units has a higher priority order than discharge from the plurality of cleaning units.

3. The substrate processing apparatus according to claim 1, wherein, when the total discharge flow rate obtained as a result of controlling opening and closing of the discharge valves provided in the plurality of polishing units and the plurality of cleaning units, based on the predetermined priority orders, so that the total discharge flow rate from the plurality of polishing units and the plurality of cleaning units is the predetermined flow rate or less has a capacity to reach the predetermined flow rate, the controller controls opening and closing of the discharge valve of a unit that has a discharge flow rate equal to or less than the capacity, over the priority orders, so that the total discharge flow rate is an approximate upper limit of the predetermined flow rate.

4. The substrate processing apparatus according to claim 1,
wherein a plurality of the discharge valves are provided for each of the plurality of polishing units, and a plurality of the discharge valves are provided for each of the plurality of cleaning units, and,
based on the predetermined priority orders, the controller controls opening and closing of the plurality of the discharge valves provided in each of the plurality of polishing units and the plurality of cleaning units, by opening or closing all the plurality of the discharge valves, so that the total discharge flow rate from the plurality of polishing units and the plurality of cleaning units is the predetermined flow rate or less.

5. The substrate processing apparatus according to claim 4, wherein, when the total discharge flow rate obtained as a result of performing control by opening or closing all the plurality of the discharge valves provided in each of the plurality of polishing units and the plurality of cleaning units, based on the predetermined priority orders, so that the total discharge flow rate from the plurality of polishing units and the plurality of cleaning units is the predetermined flow rate or less has a capacity to reach the predetermined flow rate, and the capacity is smaller than a discharge flow rate of any of the plurality of polishing units and the plurality of cleaning units, the controller controls opening and closing of each of the plurality of the discharge valves provided in each of the plurality of polishing units and the plurality of cleaning units, so that the total discharge flow rate is an approximate upper limit of the predetermined flow rate.

\* \* \* \* \*